(12) United States Patent
Akagawa et al.

(10) Patent No.: US 7,091,580 B2
(45) Date of Patent: Aug. 15, 2006

(54) SEMICONDUCTOR DEVICE

(75) Inventors: Koichi Akagawa, Aichi-ken (JP);
Toshiaki Nagase, Aichi-ken (JP);
Hiroyuki Onishi, Aichi-ken (JP); Jun Ishikawa, Aichi-ken (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

(21) Appl. No.: 10/963,024

(22) Filed: Oct. 12, 2004

(65) Prior Publication Data
US 2005/0104189 A1 May 19, 2005

(30) Foreign Application Priority Data
Nov. 19, 2003 (JP) ............................. 2003-389670

(51) Int. Cl.
*H01L 23/495* (2006.01)

(52) U.S. Cl. ....................... 257/667; 257/150; 257/177; 257/693; 257/698; 257/787; 257/E23.011; 361/820

(58) Field of Classification Search ................. 257/667, 257/177, 182; 361/820
See application file for complete search history.

(56) References Cited

U.S. PATENT DOCUMENTS 6,166,430 A * 12/2000 Yamaguchi ................. 257/666

FOREIGN PATENT DOCUMENTS

| JP | 62-104145 | 5/1987 |
| JP | 08-064723 | 3/1996 |

* cited by examiner

*Primary Examiner*—Minhloan Tran
*Assistant Examiner*—Leslie Pilar Cruz
(74) *Attorney, Agent, or Firm*—Morgan & Finnegan, LLP

(57) ABSTRACT

When a silicone gel is injected into a case, since the gel is liquid before curing, the gel attempts to rise along a minute gap formed between a front face of a first electrode and a rear face of a resin member due to capillary action. However, since the gap becomes larger at a cavity in the first electrode, the rising motion of the gel stops at the level of the cavity. More specifically, the gel is prevented from reaching portions of the first electrode and a second electrode for connection with external terminals. Further, since the rising motion of the gel can be prevented by the cavity, the first electrode and the second electrode can be arranged in a close relationship with each other.

12 Claims, 3 Drawing Sheets

SEMICONDUCTOR DEVICE

BACKGROUND OF THE INVENTION

1. Field of the Invention

The present invention relates to a semiconductor device, and more particularly to a semiconductor device such as a semiconductor power module.

2. Description of the Related Art

For example, in a semiconductor device as disclosed in JP 4-18468 A, semiconductor elements, electrodes, and soon are arranged on a base substrate and connections are made between predetermined portions through bonding wires, all of which are housed in a case, with a silicone gel injected therein and cured to protect the elements and the like inside the case.

However, in an encapsulated-type semiconductor device as described in the above, as illustrated in FIG. 6, one electrode 1 is fixed to a base substrate 2, and another electrode 3 is supported by a resin member 5 integrally formed with a cover 4. The two electrodes 1 and 3 are led out in a close relationship with each other from within a case 6, forming a minute gap D between the one electrode 1 and the resin member 5. In some cases, a gel 7 before curing rises along the gap D due to capillary action to reach and adhere to portions of the electrodes 1 and 3 for connection with external terminals. When the gel 7 adheres to the portions of the electrodes 1 and 3 for connection with external terminals, since the gel 7 is an insulator, the connection between the electrodes 1 and 3 and external terminals may be poor.

Here, by setting large the gap formed between the one electrode and the resin member supporting the other electrode, the rising motion of the gel along the gap can be prevented. However, such a larger gap makes the distance larger between the two electrodes as well, which increases the total size of the device.

SUMMARY OF THE INVENTION

The present invention is made to solve the above-mentioned problem. An object of the present invention is to provide a semiconductor device which can prevent rising motion of a gel without increasing the size of the semiconductor device.

According to the present invention, there is provided a semiconductor device including:

a base substrate;

a semiconductor element arranged on a surface of the base substrate;

a case having an open upper portion for housing the semiconductor element therein;

a first electrode led out from within the case to above the case;

a resin member arranged to face the first electrode with a gap between the resin member and the first electrode; and an insulating encapsulant to be cured after being injected in a liquid state into the case, a cavity being formed in at least one of the resin member and the first electrode for preventing, by partially making larger the gap formed between the resin member and the first electrode, the encapsulant before curing from rising due to capillary action to a portion of the first electrode for connection with an external terminal.

When the encapsulant is injected into the case, due to capillary action, the encapsulant attempts to rise along the gap formed between the electrode and the resin member. However, since the gap becomes larger at the cavity, such rising motion of the encapsulant stops at the level of the cavity, and thus, the encapsulant is prevented from reaching the portion of the electrode for connection with an external terminal.

DETAILED DESCRIPTION OF THE PREFERRED EMBODIMENT

Hereinafter, an embodiment of the present invention will be described with reference to the accompanying drawings.

Figure 1:
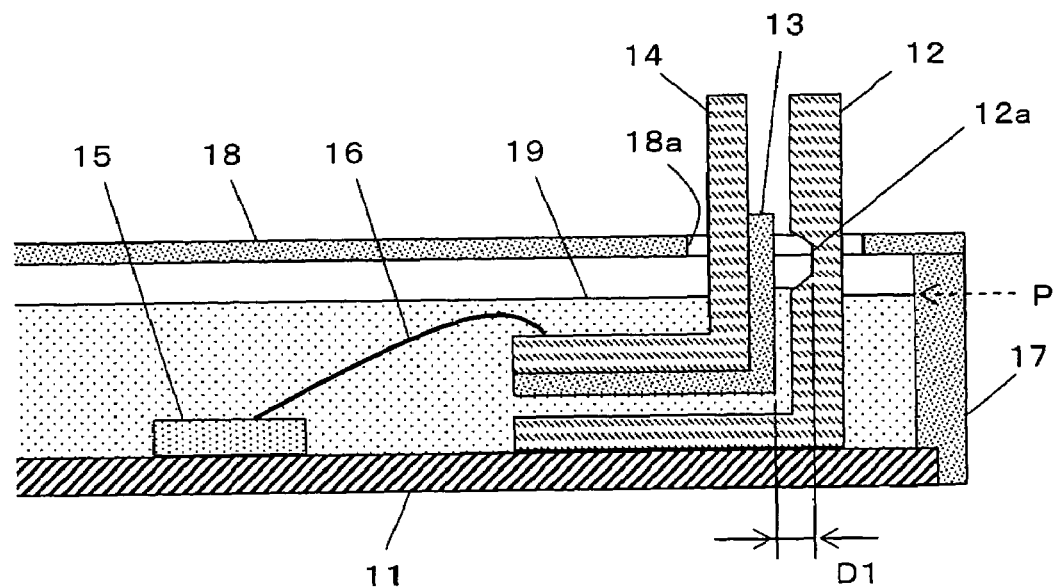
FIG. 1 is a partial cross-sectional view illustrating a semiconductor device according to an embodiment of the present invention.

FIG. 1 illustrates a partial cross-sectional view of a semiconductor device according to the embodiment of the present invention. The semiconductor device is used as a power module or the like. The semiconductor device has a base substrate 11. The base substrate 11 has a first electrode 12 soldered to a surface thereof. The first electrode 12 is L-shaped in cross section. Arranged in the vicinity of the first electrode 12 is a resin member 13 which is L-shaped in cross section so as to face the first electrode 12 in a spaced relationship. A minute gap is formed between a front face of the first electrode 12 and a rear face of the resin member 13. A second electrode 14 which is L-shaped in cross section is fixed to a front face of the resin member 13. Thus, the first electrode 12 and the second electrode 14 are arranged so as to face each other in a close relationship.

Here, an upright portion of the first electrode 12 has a concave cavity 12a formed on a front face thereof, that is, on a face thereof facing the resin member 13, such that the gap formed between the front face of the first electrode 12 and the rear face of the resin member 13 becomes partially larger at the cavity 12a. The cavity 12a is formed so as to extend like a groove over the width of the first electrode 12. It is to be noted that, when, for example, the thickness of the first electrode 12 is on the order of 1–1.5 mm while the minute gap formed between the front face of the first electrode 12 and the rear face of the resin member 13 is on the order of 0.2–0.5 mm, it is preferable that a gap D1 at the cavity 12a between the first electrode 12 and the resin member 13 is set to be on the order of 1 mm.

A semiconductor element 15 is arranged on the surface of the base substrate 11 in a spaced relationship with the first electrode 12. An electrode on a surface of the semiconductor element 15 and the second electrode 14 are connected through a bonding wire 16. Further, a case 17 is fixed to a peripheral portion of the base substrate 11. The first electrode 12, the second electrode 14, the semiconductor element 15, and the like arranged on the base substrate 11 are housed in the case 17. The case 17 has a cover 18 disposed thereon. The resin member 13 is integrally formed with the cover 18 to support the second electrode 14. The first electrode 12 and the second electrode 14 are led out to the external of the case 17 through an opening 18a formed in the cover 18, such that portions of the first electrode 12 and the second electrode 14 which protrude above the cover 18 can be connected with external terminals (not shown). A silicone gel 19 as an encapsulant for protecting the element and the like housed in the case 17 has been injected into the case 17 to a predetermined liquid level P and has been cured.

It is to be noted that the level of the cavity 12a formed in the first electrode 12 is higher than the predetermined liquid level P of the gel 19 and lower than the level of the portions of the first electrode 12 and the second electrode 14 for connection with external terminals.

The operation of the semiconductor device having the above-mentioned structure is now described. When the silicone gel 19 is injected into the case 17, since the gel 19 is liquid before curing, the gel 19 attempts to rise along the minute gap formed between the front face of the first electrode 12 and the rear face of the resin member 13 due to capillary action. However, since the gap becomes larger at the cavity 12a in the first electrode 12, the rising motion of the gel 19 stops at the level of the cavity 12a. More specifically, the gel 19 is prevented from reaching the portions of the first electrode 12 and the second electrode 14 for connection with external terminals. Therefore, it is possible to prevent poor connection of the first electrode 12 and the second electrode 14 with external terminals, due to the adhesion of the gel 19 to the portions of the first electrode 12 and the second electrode 14 for connection with external terminals.

Further, since the rising motion of the gel 19 can be prevented by the cavity 12a without the necessity of making the distance larger between the first electrode 12 and the second electrode 14, the first electrode 12 and the second electrode 14 can be arranged in a close relationship with each other, which allows the entire device to be miniaturized and allows inductance to be decreased which is caused in a circuit containing the first electrode 12 and the second electrode 14.

Figure 2:
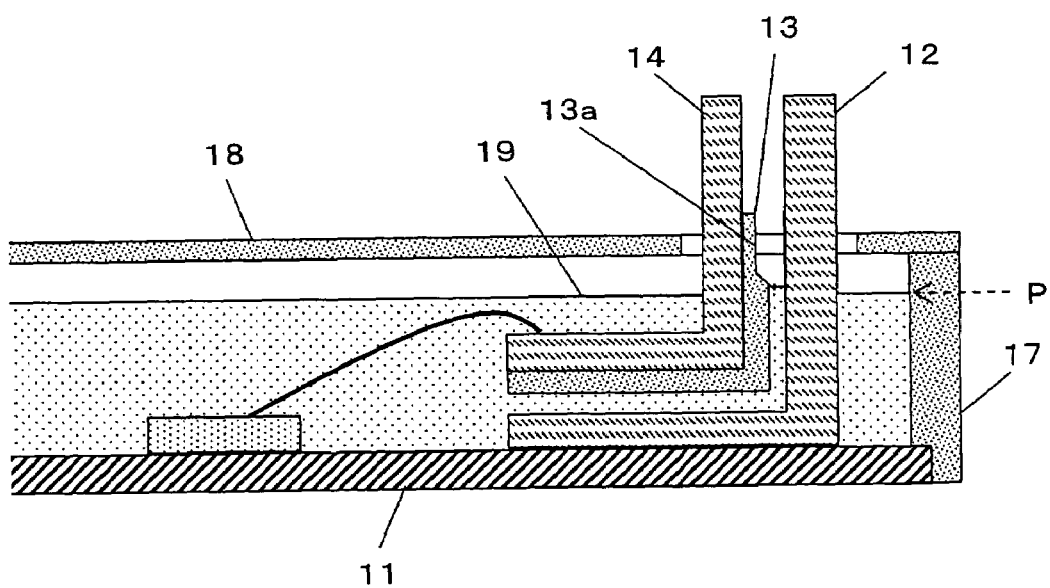
FIGS. 2 to 5 are partial cross-sectional views illustrating modified embodiments, respectively.

It is to be noted that, although the first electrode 12 has the cavity 12a formed therein in the above-mentioned embodiment, the rear face of the resin member 13 facing the first electrode 12 may alternatively have a step-like cavity 13a extending over the width of the resin member 13 as illustrated in FIG. 2. Since the minute gap formed between the front face of the first electrode 12 and the rear face of the resin member 13 becomes larger at the cavity 13a, the rising motion of the gel 19 is prevented at the level of the cavity 13a, and thus, similar effects to those of the above-mentioned embodiment can be produced.

Figure 3:
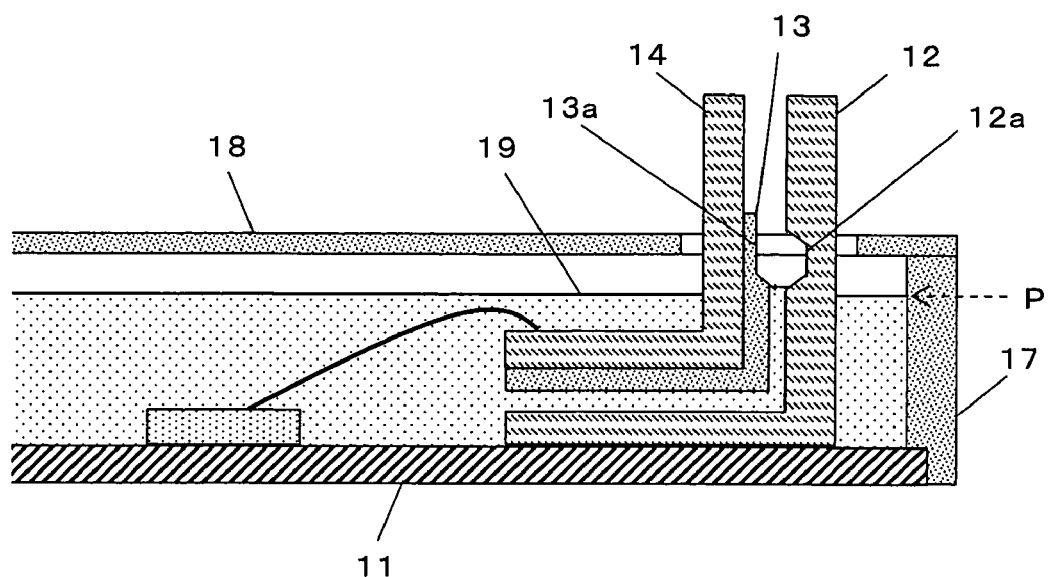

Further, as illustrated in FIG. 3, when the first electrode 12 and the resin member 13 have cavities 12a and 13a formed therein, respectively, since it is possible to make the gap still larger at the cavities 12a and 13a, the rising motion of the gel can be prevented more efficiently.

Figure 4:
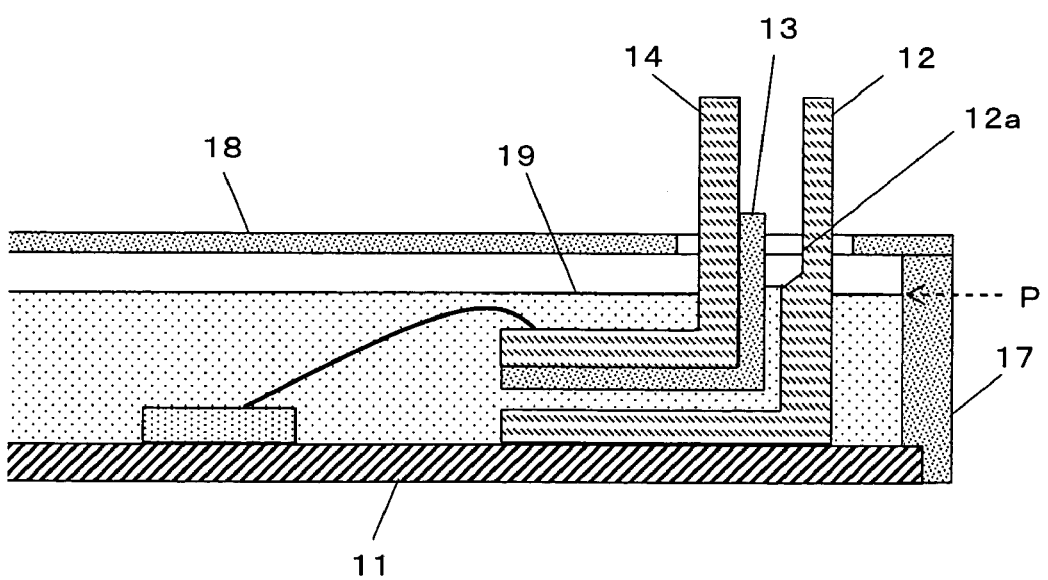

Still further, as illustrated in FIG. 4, even when a step-like cavity 12a extending over the width of the first electrode 12 is formed in the first electrode 12 as far as the thickness is acceptable, similarly to the case of the above-mentioned embodiment, the rising motion of the gel 19 can be prevented at the level of the cavity 12a.

Further, the cavity 13a in the resin member 13 of FIGS. 2 and 3 can be formed as being groove-like rather than step-like.

Here, the cavity 12a in the electrode 12 can be formed by a cutting process, presswork, or the like, while the cavity 13a in the resin member 13 can be formed by a cutting process, molding, or the like.

Figure 5:
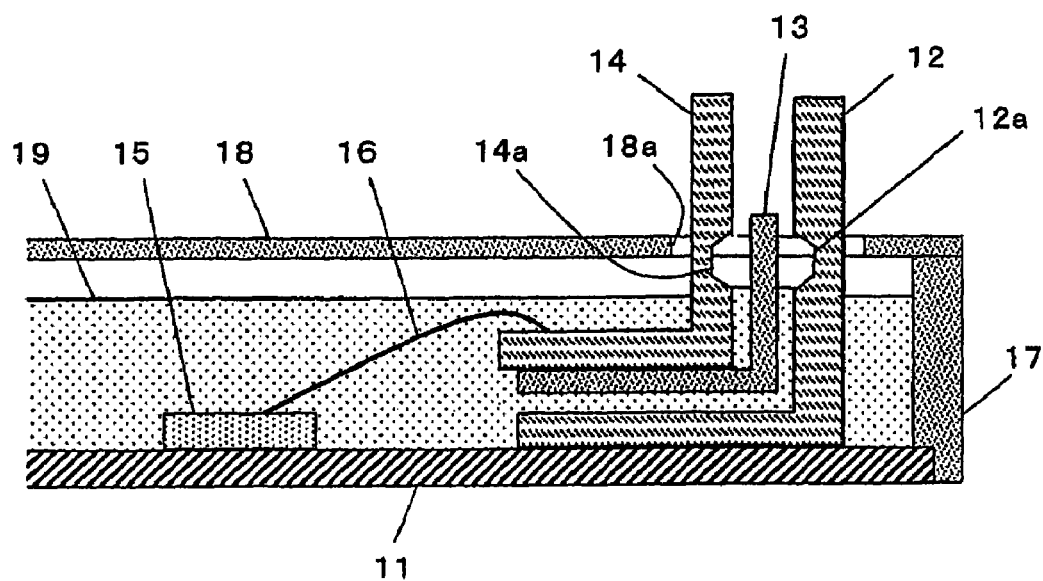
Figure 6:
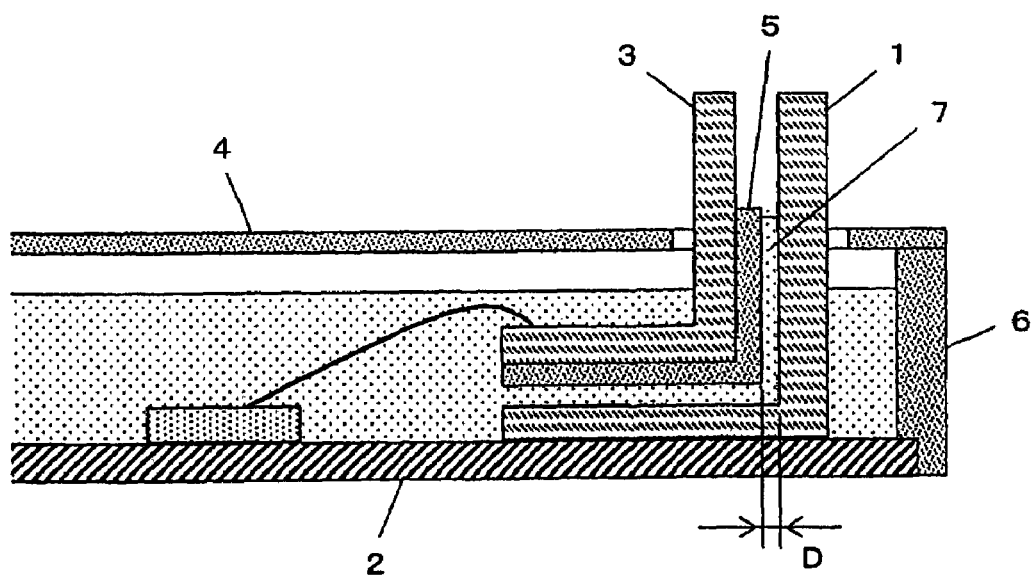
FIG. 6 is a partial cross-sectional view of a conventional semiconductor device.

Further, in the above-mentioned embodiments, as illustrated in FIG. 5, the second electrode 14 may be arranged so as to make a gap between the second electrode 14 and the resin member 13. In this case, by forming a cavity 14a similar to the cavity 12a or 13a on a rear face of the second electrode 14 facing the resin member 13, the rising motion of the gel 19 can be prevented by the cavity 14a. Similarly, the rising motion of the gel 19 can be also prevented by forming a cavity on the front face of the resin member 13 facing the second electrode 14. Still further, by forming cavities both on the front face of the resin member 13 and on the rear face of the second electrode 14, the rising motion of the gel can be prevented more efficiently.

It is to be noted that, in the above-mentioned embodiments, since the silicone gel 19 is used as the encapsulant, the flexibility of the gel 19 can absorb vibration of the semiconductor device. Further, even when epoxy resin or the like is used as the encapsulant instead of the silicone gel 19, the cavity prevents rising motion of the encapsulant due to capillary action, and thus, effects similar to those of the above-mentioned embodiments can be obtained.

The resin member 13 may be fixed to the case 17 instead of being fixed to the cover 18.

Further, although a case where two electrodes are arranged in a close relationship with each other is described in the above embodiments, similar effects can be obtained in a case where three or more electrodes are arranged in a close relationship with one another.

According to the present invention, the semiconductor device includes a first electrode led out from within the case and a resin member arranged so as to face the first electrode with a gap therebetween, and in the semiconductor device, a cavity is formed in at least one of the resin member and the first electrode for preventing, by partially making larger the gap formed between the resin member and the first electrode, the encapsulant before curing from rising due to capillary action to a portion of the first electrode for connection with an external terminal. Consequently, it is possible to prevent the rising motion of the gel without increasing the size of the semiconductor device.

What is claimed is:

1. A semiconductor device comprising:
a base substrate;
a semiconductor element arranged on a surface of the base substrate;
a case having an open upper portion for housing the semiconductor element therein;
a first electrode having an upright portion led out from within the case to above the case;
a resin member having an upright portion arranged to face the upright portion of the first electrode with a gap therebetween; and
an insulating encapsulant to be cured after being injected in a liquid state into the case,
a cavity being formed on at least one of the facing surfaces of the upright portions of the resin member and the first electrode for preventing, by partially making larger the gap formed therebetween, the encapsulant before curing from rising due to capillary action to a portion of the first electrode for connection with an external terminal.

2. A semiconductor device according to claim 1, wherein a level of the cavity is lower than a level of the portion of the first electrode for connection with an external terminal and higher than a predetermined liquid level of the encapsulant injected into the case.

3. A semiconductor device according to claim 1, wherein the first electrode is fixed to the surface of the base substrate and the resin member is fixed to a cover arranged on the case.

4. A semiconductor device according to claim 1, wherein the first electrode is fixed to the surface of the base substrate and the resin member is fixed to the case.

5. A semiconductor device according to claim 1, further comprising a second electrode facing the first electrode with the resin member between the second electrode and the first electrode and arranged to be in contact with a front face of the resin member.

6. A semiconductor device according to claim 1, further comprising: a second electrode facing the first electrode with the resin member between the second electrode and the first electrode and arranged with a gap between the second electrode and a front face of the resin member, another cavity being formed in at least one of the resin member and the second electrode for partially making larger the gap formed between the resin member and the second electrode.

7. A semiconductor device according to claim 1, wherein the cavity extends like a groove over a width of at least one of the resin member and the first electrode.

8. A semiconductor device according to claim 1, wherein the cavity extends like a step over a width of at least one of the resin member and the first electrode.

9. A semiconductor device according to claim 1, wherein the cavity is formed by a cutting process.

10. A semiconductor device according to claim 1, wherein a silicone gel is used as the encapsulant.

11. A semiconductor device according to claim 1, wherein the cavity is formed in each of the first electrode and the resin member.

12. A semiconductor device according to claim 1, wherein, when the gap formed between the first electrode and the resin member is on the order of 0.2–0.5 mm, the gap at the cavity between the first electrode and the resin member is set to be on the order of 1 mm.

* * * * *

UNITED STATES PATENT AND TRADEMARK OFFICE
CERTIFICATE OF CORRECTION

PATENT NO. : 7,091,580 B2 Page 1 of 1
APPLICATION NO. : 10/963024
DATED : August 15, 2006
INVENTOR(S) : Akagawa et al.

It is certified that error appears in the above-identified patent and that said Letters Patent is hereby corrected as shown below:

Column 1, line 11, please delete "and soon" and insert therefor --and so on--;

Signed and Sealed this

Fourth Day of September, 2007

JON W. DUDAS
*Director of the United States Patent and Trademark Office*